United States Patent
Yashiki et al.

(10) Patent No.: US 6,898,490 B2
(45) Date of Patent: May 24, 2005

(54) VEHICLE CONTROLLER FOR CONTROLLING REWRITING DATA IN A NONVOLATILE MEMORY

(75) Inventors: Tetsuya Yashiki, Wako (JP); Masanori Matsuura, Wako (JP)

(73) Assignee: Honda Giken Kogyo Kabushiki Kaisha, Tokyo (JP)

(*) Notice: Subject to any disclaimer, the term of this patent is extended or adjusted under 35 U.S.C. 154(b) by 254 days.

(21) Appl. No.: 10/267,537

(22) Filed: Oct. 9, 2002

(65) Prior Publication Data
US 2003/0069671 A1 Apr. 10, 2003

(30) Foreign Application Priority Data
Oct. 9, 2001 (JP) ......................................... 2001-311961

(51) Int. Cl.⁷ ......................... G06F 19/00; G06F 12/00
(52) U.S. Cl. ......................... 701/1; 711/100; 711/103; 711/154; 711/167; 341/50
(58) Field of Search ......................... 701/1, 35; 341/50; 711/100, 103, 154, 167, 150, 155, 120

(56) References Cited

U.S. PATENT DOCUMENTS 6,405,279 B1 * 6/2002 Kondo et al. ............... 711/103
6,600,993 B1 * 7/2003 Kaneko et al. .............. 701/208

FOREIGN PATENT DOCUMENTS

| JP | 57-059243 | 4/1982 |
| JP | 60-138635 | 7/1985 |
| JP | 63-223901 | 9/1988 |
| JP | 03-109663 | 5/1991 |
| JP | 2000-020389 | 1/2000 |

* cited by examiner

Primary Examiner—Gary Chin
Assistant Examiner—Ronnie Mancho
(74) Attorney, Agent, or Firm—Lahive & Cockfield, LLP; Anthony A. Laurentano, Esq.

(57) ABSTRACT

A vehicle controller comprises a first buffer for storing at least one data block, a second buffer for storing at least one data block, and a rewritable non-volatile memory for storing information for controlling a vehicle. The controller receives a data block from an external rewriting device to store it in the first buffer. The data block stored in the first buffer is transferred to the second buffer. The data block stored in the second buffer is written into the memory. When a first data block is written into the memory, a subsequent data block is received. Thus, the time required to rewrite data stored in the nonvolatile memory is reduced.

20 Claims, 11 Drawing Sheets

VEHICLE CONTROLLER FOR CONTROLLING REWRITING DATA IN A NONVOLATILE MEMORY

TECHNICAL FIELD

The present invention relates to a rewriting system in which data stored in a nonvolatile memory of the vehicle controller is rewritten with data received from an external rewriting device.

BACKGROUND OF THE INVENTION

At present, vehicle control includes engine control based on air-fuel ratio, fuel injection amount, emission, etc., and vehicle body control of such elements as power windows, an airbag, and an ABS. Such control is carried out by electronic control units, hereinafter referred to as "ECU." One or more ECUs control a vehicle in various manners based on the conditions of the vehicle detected by various sensors mounted on the vehicle.

An ECU comprises a central processing unit (CPU), a ROM (read-only memory) for storing programs and data to be executed, a RAM (random access memory) for providing an operational work space at the runtime to store operation results and an input/output interface for receiving signals from various sensors and sending control signals to each engine part. A ROM may comprise a rewritable nonvolatile memory such as a flash memory and an EEPROM.

A system for rewriting data stored in such a nonvolatile memory is known. Such a system typically comprises a rewriting device, an ECU, and a serial communication path for interconnecting the rewriting device and the ECU. In operation, the ECU erases data stored in the nonvolatile memory, and receives data sent from the rewriting device through the serial communication path. The received data is written in a predetermined region of the nonvolatile memory. After the time required to write the data into the nonvolatile memory has elapsed, the rewriting device sends the next data to be written into the memory to the ECU.

For example, Japanese Patent Application Unexamined Publication (Kokai) No. S63-223901 discloses a method for updating programs stored in an EEPROM of an ECU of a vehicle through a SCI (serial communication interface) terminal in response to a request from an external rewriting device without dismounting the ECU from the vehicle.

A timing chart for rewriting operation in such a conventional rewriting system is shown in FIG. 12. An external rewriting device sends a data block 1 to an ECU. The time required for the data block 1 to arrive at the ECU from the rewriting device is Ttx. The ECU receives the data block 1 and starts writing the data block 1 into the memory. The time required to write the data block 1 into the memory is Twr. The rewriting device sends a next data block 2 to the ECU after writing the data block 1 into the memory is completed. The ECU receives the data block 2 and starts writing the data block 2 into the memory. Thus, sending and writing of data blocks are sequentially performed.

As shown in FIG. 12, assuming that the size of each data block is equal, rewriting operation takes at least time "(Ttx+ Twr)×Ntx." As described above, Ttx indicates the time required for one data block to be sent from the rewriting device to the ECU. Twr indicates the time required for one data block to be written into the memory. Ntx indicates the number of times of sending data.

The writing time Twr is dependent on the specification of the nonvolatile memory. The number of times of sending is dependent on the amount of the data to be rewritten. Therefore, in order to shorten the time required to rewrite data in the nonvolatile memory, the sending time Ttx needs to be decreased.

The communication speed needs to be increased so as to decrease the sending time Ttx. However, the rewriting device and the ECU are usually interconnected via a serial communication. As long as the serial communication is used, increase of the communication speed is not easily achieved because the communication speed is specified by specifications of the cable.

Thus, there exists a need for a device and method that reduces the time to rewrite data stored in a nonvolatile memory without increasing the communication speed.

SUMMARY OF THE INVENTION

According to one aspect of the invention, a vehicle controller comprises a first buffer for storing at least one data block, a second buffer for storing at least one data block, and a rewritable nonvolatile memory for storing information for controlling a vehicle. The controller receives a data block from an external rewriting device to store it in the first buffer. The data block stored in the first buffer is transferred to the second buffer. The data block stored in the second buffer is written into the memory. When a first data block is written into the memory, a subsequent data block is received. Thus, the time required to rewrite data stored in the nonvolatile memory is reduced. The first and second buffers may be implemented by a memory having an access time faster than the nonvolatile memory.

According to one embodiment of the invention, the controller starts receiving the subsequent data block in response to completion of transferring the first data block.

According to another embodiment of the invention, the controller determines whether there is free space in the first buffer. If there is free space in the first buffer, the controller starts receiving the subsequent data block from the external rewriting device.

According to one embodiment of the invention, the controller starts transferring the subsequent data block from the first buffer to the second buffer in response to completion of writing the first data block into the memory.

According to one aspect of the invention, after writing the first data block into the memory is completed, the controller starts writing the subsequent data block into the memory if the subsequent data block is stored in the second buffer by the transfer means. A delay between an end of writing the first data block and a start of writing the subsequent data block is equal to or less than a time required to transfer the subsequent data block from the first buffer to the second buffer. The reduced delay in writing operation is obtained.

According to another embodiment of the invention, after receiving the first data block is completed, the controller starts receiving the subsequent data block if free space is produced in the first buffer by the transfer means. A delay between an end of receiving the first data block and a start of receiving the subsequent data block is equal to or less than a time required to transfer the first data block from the first buffer to the second buffer. The reduced delay in receiving operation is obtained.

According to one embodiment of the invention, the second buffer stores two or more data blocks. The controller transfers the subsequent data block from the first buffer to the second buffer in response to completion of receiving the subsequent data block. The controller starts writing the subsequent data block into the memory in response to completion of writing the first data block into the memory. There is no delay between an end of writing the first data block and a start of writing the subsequent data block.

According to another embodiment of the invention, the first buffer stores two or more data blocks. The controller starts receiving the subsequent data block in response to completion of receiving the first data block. There is no delay between an end of receiving the first data block and a start of receiving the subsequent data block.

According to one aspect of the invention, at least one intermediate buffer is provided between the first buffer and the second buffer. The controller performs a first transfer for transferring a data block stored in the first buffer to the intermediate buffer. The controller further performs a second transfer for transferring the data block stored in the intermediate buffer to the second buffer. The first transfer is started if transferring the first data block from the intermediate buffer to the second buffer is completed to produce free space in the intermediate buffer. The second transfer is started if writing the first data block into the memory is completed to produce free space in the second buffer. The intermediate buffer thus provided accommodates a variation in writing time.

DESCRIPTION OF THE PREFERRED EMBODIMENTS

The present invention for rewriting data stored in a nonvolatile memory of a vehicle controller with data received from an external rewriting device will be described referring to attached drawings.

Figure 1:
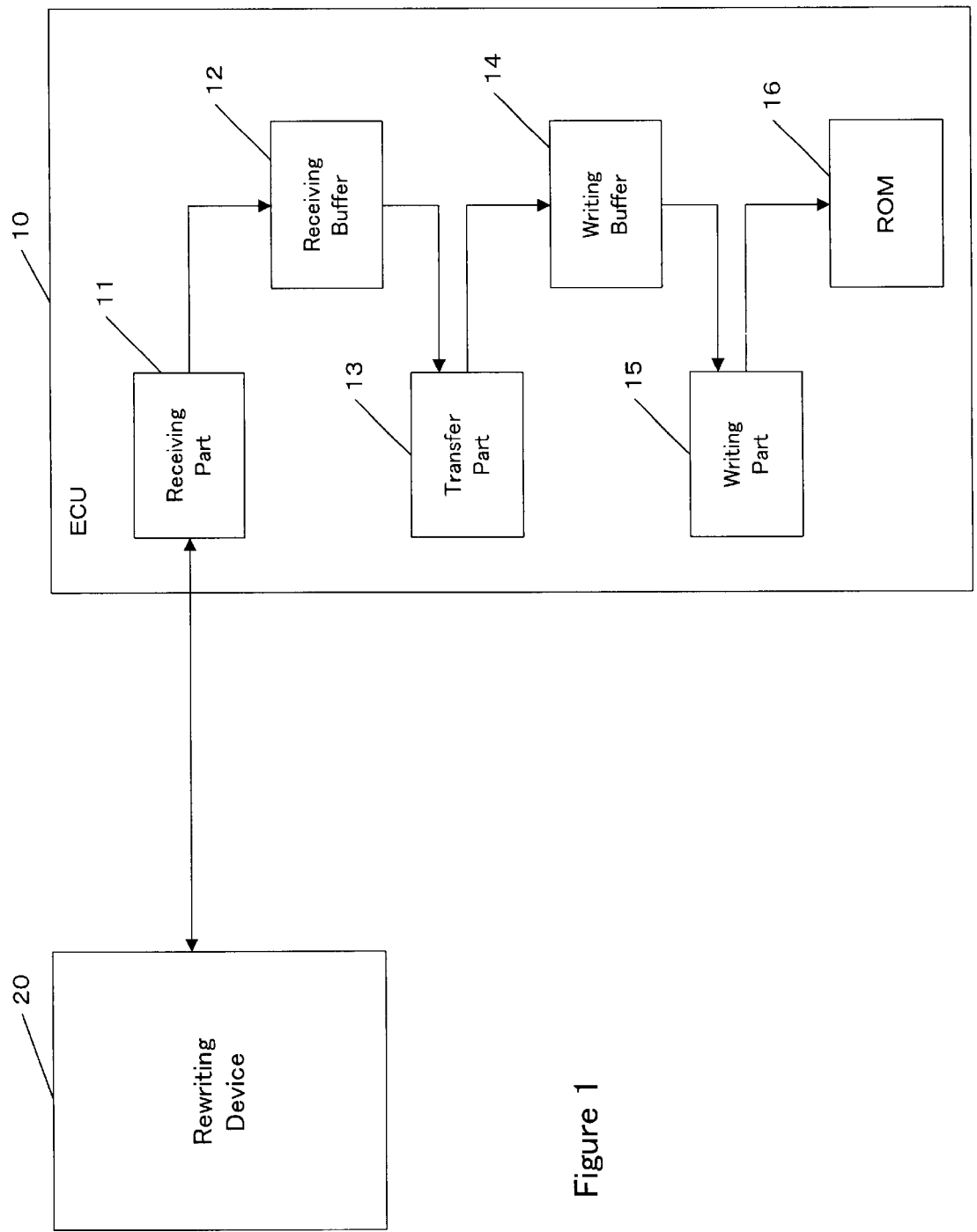
FIG. 1 is a block diagram showing a rewriting system according to one embodiment of the invention.

FIG. 1 shows a schematic structure of a rewriting system according to one embodiment of the present invention. The rewriting system comprises an ECU 10 and an external rewriting device 20. The rewriting device 20 is authorized by a manufacturer of the vehicle. When the rewriting device 20 is connected to the ECU 10 via a serial communication bus, data and programs stored in a ROM 16 of the ECU 10 can be rewritten by the rewriting device 20.

The ECU 10 is composed of a microcomputer and related circuit elements. The ECU 10 comprises a central processing unit (hereafter, referred to simply as "CPU"), a nonvolatile memory or a ROM (read only memory) 16 for storing programs to be executed and data, a RAM (random access memory) for providing work areas at the time of execution and for storing the calculation results or the like, and an input/output interface for receiving signals detected by various kinds of sensors and sending control signals to various engine parts. The signals detected by the sensors include engine rotational speed, engine temperature, intake temperature, battery voltage, ignition switch, etc. The CPU invokes control programs and data stored in the ROM and performs operations based on the detected signals from the input/output interface. The CPU outputs the results to various parts of the vehicle via the input/output interface to control various functions of the vehicle.

For the sake of simplicity, only the ROM 16 of these components is shown in the ECU 10 of FIG. 1. One embodiment in which data stored in the ROM 16 is rewritten will be described. However, the following description is applicable to an embodiment in which programs stored in the ROM 16 are rewritten.

The ECU 10 further comprises an interface (not shown) that enables communication with the rewriting device 20. Through the interface, the ECU 10 and the rewriting device 20 perform serial communications.

The ROM 16 is a nonvolatile memory from which stored data can be erased and to which new data can be written. The ROM 16 can be implemented with, for example, a flash memory or EEPROM.

A receiving part 11, transfer part 13 and writing part 15 are typically implemented with programs. These programs are stored, for example, in a non-rewritable ROM (not shown). A non-rewritable ROM is a nonvolatile memory in which stored data cannot be changed. Alternatively, the receiving part 11, transfer part 13 and writing part 15 may be implemented with hardware and/or firmware components.

The non-rewritable ROM can be implemented by using a mask ROM for which data is fixed during manufacturing and from or to which data cannot be subsequently erased or written, or by using a PROM to which data can be written only once. Alternatively, the non-rewritable ROM can be implemented by specifying a part of the memory area of a rewritable ROM as an unchangeable area.

For example, after a non-rewritable area in which a program or the like is stored has been specified in an EEPROM, a rewritable area is specified with start and end addresses in the unfilled space of the memory.

A receiving buffer 12 and writing buffer 14 are typically implemented with a RAM to which data is written and from which data therein is erased at a higher speed in comparison with a ROM. For example, SRAM, SDRAM (synchronous DRAM) and the like may be used. The receiving buffer 12 and the writing buffer 14 may be physically separated. Alternatively, the receiving buffer 12 and the writing buffer 14 may be implemented in a single RAM.

Figure 2:
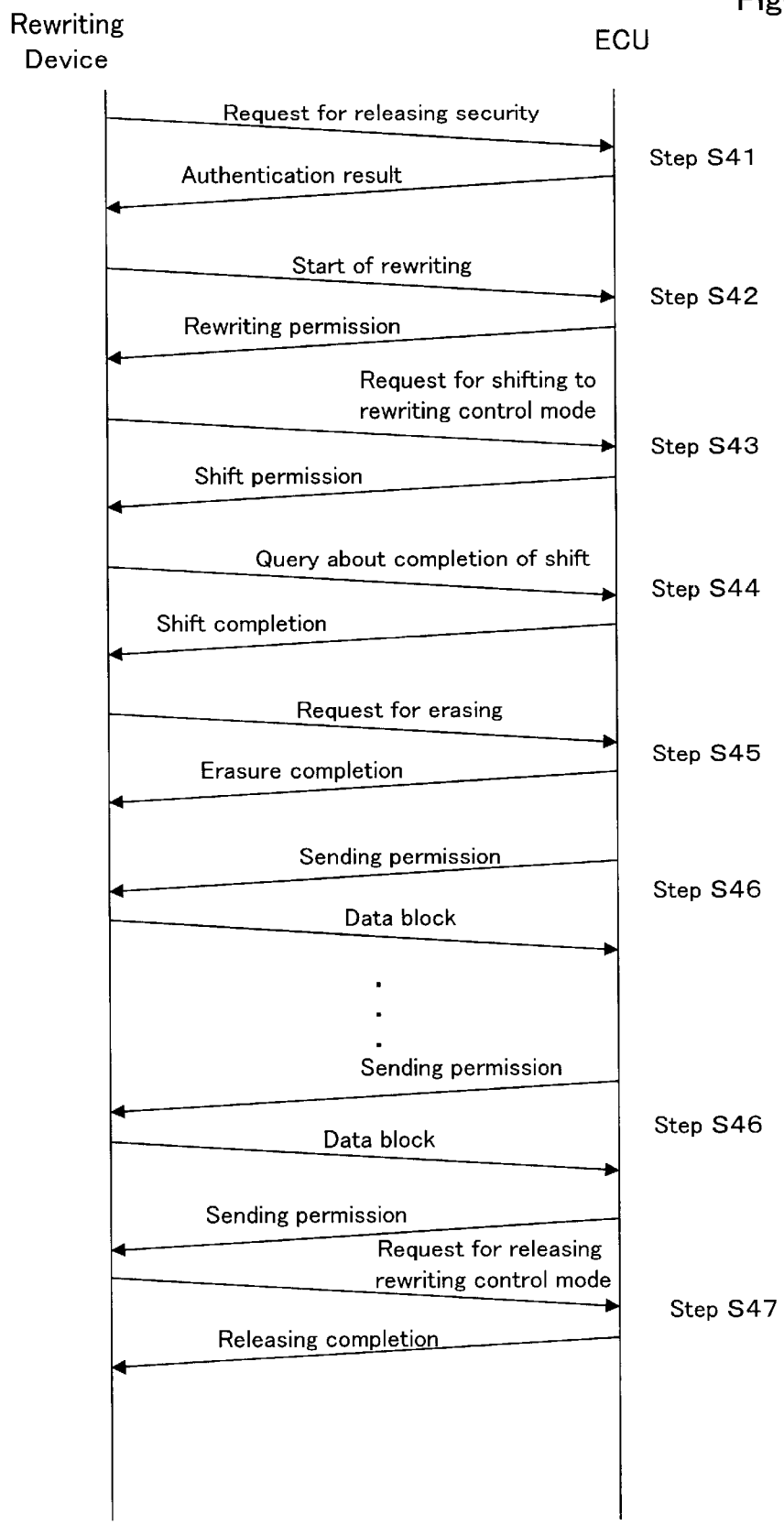
FIG. 2 is a sequence of rewriting operation according to a first embodiment of the invention.

Referring to FIGS. 1 and 2, operation of rewriting data stored in the ROM 16 with data received from the rewriting device 20 in accordance with a first embodiment of the invention will be described.

Data from the rewriting device 20 is sent to the ECU 10 in data blocks. For the sake of simplicity, it is assumed that a data block 1, a data block 2, a data block 3, . . . are sequentially sent. One cycle includes a series of steps performed for a period from the time when a data block is sent from the rewriting device to the time when the data block is written into the ROM 16. It is further assumed that each of the receiving buffer 12 and the writing buffer 14 has space for storing one data block.

Rewriting operation is initiated by operating the rewriting device 20 after the rewriting device 20 is connected to the ECU 10. Alternatively, rewriting operation may be initiated by operating the ECU 10.

In step S41, the rewriting device 20 sends to the ECU 10 a signal indicative of a request for releasing security. The ECU 10 responds to the signal to start an authentication process for confirming that the authorized rewriting device is connected thereto. If the ECU 10 authenticates the rewriting device 20, the ECU 10 sends to the rewriting device 20 a signal indicative of a success of the authentication. If the ECU 10 fails to authenticate the rewriting device 20, the ECU 10 sends to the rewriting device 20 a signal indicative of a failure of the authentication.

If the ECU 10 authenticates the rewriting device 20, the process proceeds to step S42, wherein the rewriting device 20 sends to the ECU 10 a signal indicative of a start of rewriting. The ECU 10 responds to the signal by returning a rewriting permission signal.

At step S43, the rewriting device 20 sends a request for shifting to a rewriting control mode to the ECU 10. The ECU 10 sends a shift permission signal and shifts to the rewriting control mode, for example, by setting a rewriting control flag to one. At step S44, the rewriting device 20 queries the ECU 10 about completion of shifting to the rewriting control mode. If the shift is completed, the ECU 10 sends a shift completion signal to the rewriting device 20.

At step S45, the rewriting device 20 requests the ECU 10 to erase data stored in the ROM 16. More specifically, the rewriting device 20 sends a memory address of the ROM 16 in which data to be erased is stored. The ECU 10 erases the data in the ROM 16 in accordance with the received memory address. When erasure of the data is completed, the ECU 10 sends an erasure completion signal to the rewriting device 20.

At step S46, the receiving part 11 of the ECU 10 sends a sending permission signal to the rewriting device 20. When the shift to the rewriting control mode is completed, the receiving buffer is empty because no data block has been received. Alternatively, the receiving part 11 may send a sending permission signal after it is confirmed that there is free space in the receiving buffer. If the rewriting device 20 receives the sending permission signal, it sends a data block 1 to the ECU 10. The receiving part 11 of the ECU 10 receives the data block 1 and stores it in the receiving buffer 12.

At this moment, the writing buffer 14 is empty because no data block has been written into the ROM 16. The transfer part 13 reads out the data block 1 stored in the receiving buffer 12 and stores it in the writing buffer 14. Alternatively, the transfer part 13 may start transferring the data block 1 after it confirms that the writing buffer 14 is empty.

When the transfer of the data block 1 from the receiving buffer 12 to the writing buffer 14 is completed, the transfer part 13 erases the data block 1 from the receiving buffer 12. In other words, the transfer part 13 moves the data block 1 from the receiving buffer 12 to the writing buffer 14.

The transfer part 13 issues a transfer completion signal when the transfer is completed. The transfer completion signal indicates that free space is produced in the receiving buffer 12. In response to the transfer completion signal, the receiving part 11 sends a sending permission signal to the rewriting device 20 for permitting the rewriting device 20 to send a next data block 2.

The writing part 15 reads out the data block 1 stored in the writing buffer 14. The writing part 15 extracts an address included in the data block 1 to write the data block 1 in an address of the ROM 16 that is indicated by the extracted address. When writing the data block 1 into the ROM 16 is completed, the writing part 15 erases the data block 1 from the writing buffer 14. The writing part 15 issues a writing completion signal. The writing completion signal indicates that free space is produced in the writing buffer 14.

If the rewriting device 20 receives the sending permission signal for the next data block 2, it sends the data block 2 to the ECU 10. The receiving part 11 of the ECU 10 stores the received data block 2 in the receiving buffer 12.

In response to the writing completion signal for the data block 1 in the previous cycle, the transfer part 13 reads out the data block 2 stored in the receiving buffer 12 and stores it in the writing buffer 14.

When the transfer of the data block 2 from the receiving buffer 12 to the writing buffer 14 is completed, the transfer part 13 erases the data block 2 from the receiving buffer 12. The transfer part 13 issues a transfer completion signal. The transfer completion signal indicates that free space is produced in the receiving buffer 12. In response to the transfer completion signal, the receiving part 11 sends a sending permission signal to the rewriting device 20 for permitting the rewriting device 20 to send a next data block 3.

The writing part 15 reads out the data block 2 stored in the writing buffer 14. The writing part 15 extracts an address included in the data block 2 to write the data block 2 in an address of the ROM 16 that is indicated by the extracted address. When writing the data block 2 into the ROM 16 is completed, the writing part 15 erases the data block 2 from the writing buffer 14. The writing part 15 issues a writing completion signal. The writing completion signal indicates that free space is produced in the writing buffer 14.

Step S46 is repeated until all the data blocks are sent to the ECU 10 by the rewriting device 20. For example, when one program is sent, the program is divided into a plurality of data blocks, each of which has a predetermined length. Step S46 is repeated until all the data blocks constituting the program are sent.

At step S47, the rewriting device 20 sends to the ECU 10 a signal indicative of a request for releasing the rewriting control mode. When writing all the data blocks into the ROM 16 is completed, the ECU 10 shifts from the rewriting control mode to an usual control mode by, for example, resetting the rewriting control flag to zero. The ECU 10 sends to the rewriting device 20 a signal indicating that the rewriting control mode is released.

Figure 3:
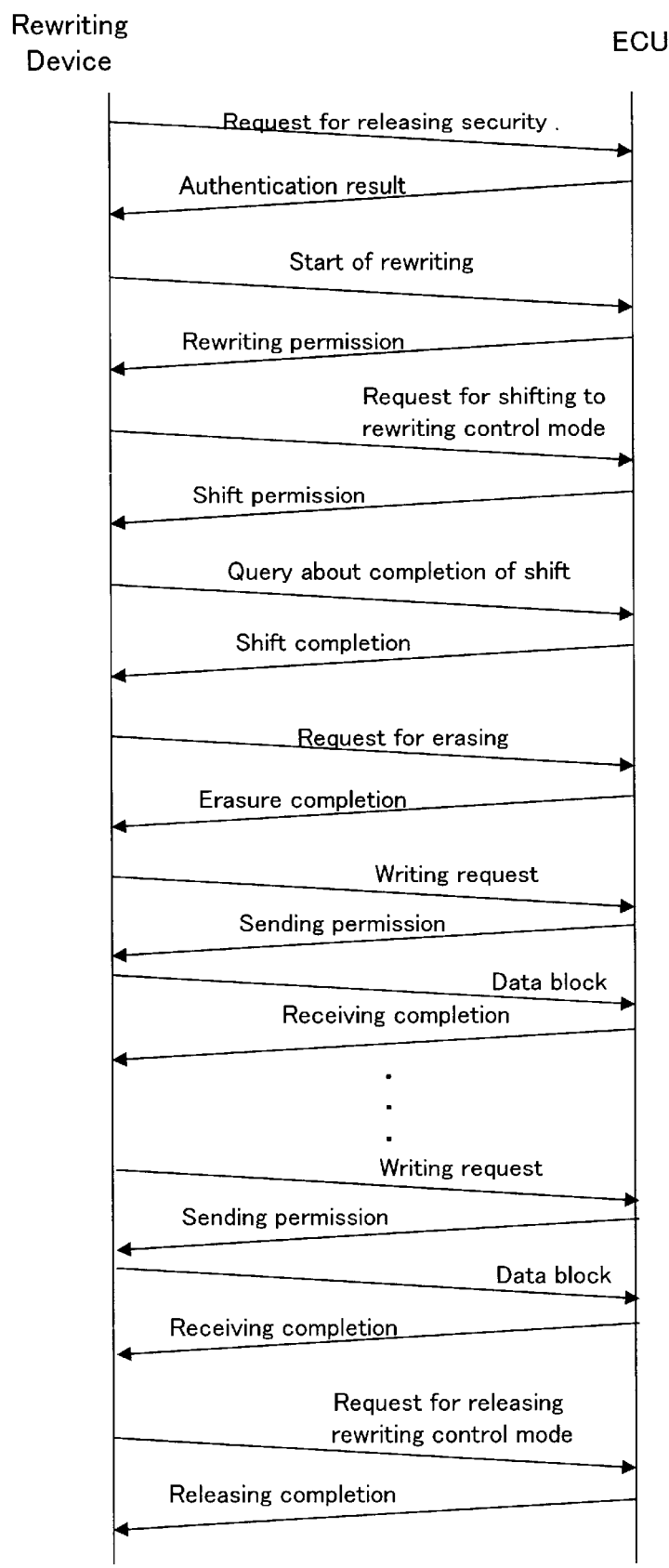
FIG. 3 is a sequence of rewriting operation according to a second embodiment of the invention.

FIG. 3 shows a sequence of rewriting operation in accordance with a second embodiment of the present invention. The sequence in the second embodiment is the same as the sequence performed in the first embodiment except control of receiving a data block from the rewriting device 20 in step S46. Writing control is the same as that of the first embodiment, so it will not be described.

If the erasure completion signal is received, the process proceeds to step S46, in which the rewriting device 20 sends a writing request signal to the ECU 10. The receiving part 11 of the ECU 10 determines whether there is free space in the receiving buffer 12. If there is free space in the receiving buffer 12, the receiving part 11 sends a sending permission signal to the rewriting device 20. If there is no free space in the receiving buffer 12, the receiving part 11 sends a rejection signal to the rewriting device 20.

If the rewriting device 20 receives the rejection signal, the rewriting device 20 resends a writing request signal to the ECU 10 after, for example, a predetermined time elapses. If the rewriting device 20 receives the sending permission signal, the rewriting device 20 sends a data block 1 to the ECU 10. The receiving part 11 of the ECU 10 receives the data block 1 and stores it in the receiving buffer 12. When storing the data block 1 in the receiving buffer 12 is completed, the receiving part 11 sends a receiving completion signal to the rewriting device 20.

If the rewriting device 20 receives the receiving completion signal, it sends a writing request signal for a next data block 2 to the ECU 10. The receiving part 11 of the ECU 10 determines whether there is free space in the receiving buffer 12. If there is free space in the receiving buffer 12, the receiving part 11 sends a sending permission signal to the rewriting device 20. If there is no free space in the receiving buffer 12, the receiving part 11 sends a rejection signal to the rewriting device 20. As described above, free space is produced in the receiving buffer 12 when the data block 1 is transferred from the receiving buffer 12 to the writing buffer 14 by the transfer part 13.

If the rewriting device 20 receives the rejection signal, the rewriting device 20 resends a writing request signal to the ECU 10 after, for example, a predetermined time elapses. When the rewriting device 20 receives the sending permission signal, the rewriting device 20 sends the next data block 2 to the ECU 10. The receiving part 11 of the ECU 10 receives the data block 2 and stores it in the receiving buffer 12. When storing the data block 2 in the receiving buffer 12 is completed, the receiving part 11 sends a receiving completion signal to the rewriting device 20.

In both the first and second embodiments, the receiving part 11 receives a next data block from the rewriting device 20 when free space is produced in the receiving buffer 12. The transfer part 13 starts transferring a data block from the receiving buffer 12 to the writing buffer 14 when free space is produced in the writing buffer 14 and the receiving buffer 12 contains the data block to be transferred. While the data block for the current cycle is written into the receiving buffer 12, the data block stored in the writing buffer 14 for the previous cycle is written into the ROM 16. Writing a data block is performed in parallel with receiving a subsequent data block, reducing the time required to rewrite the nonvolatile memory.

Alternatively, the receiving part 11 and the transfer part 13 may check the receiving buffer and the writing buffer at a constant time interval to determine whether there is free space in these buffers.

It is preferable that the size of the data block sent in one cycle is fixed (for example, eight bytes). When the size of each data block is previously specified, the size of each of the receiving and writing buffers can be adjusted to the size of the data block. Moreover, it is possible to perform receiving and writing data blocks with a high degree of parallelism. However, the data block size may be variable.

Referring to FIGS. 4 through 7, some examples of a timing chart for rewriting operation in accordance with one embodiment of this invention will be described. The embodiments shown in FIGS. 2 and 3 are applicable to any one of these timing charts.

Figure 4:
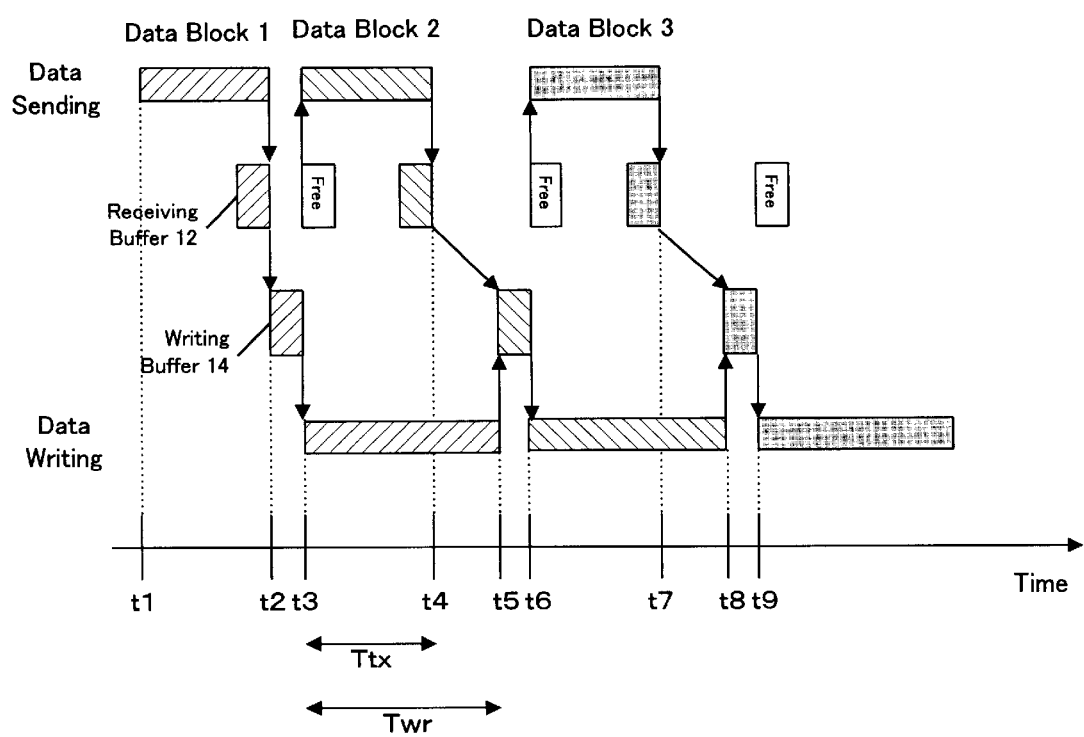
FIG. 4 is a timing chart for rewriting operation when one receiving buffer and one writing buffer are provided according to one embodiment of the invention.

FIG. 4 shows an example of a timing chart for rewriting operation wherein one receiving buffer 12 and one writing buffer 14 are provided. It is assumed that the size of each data block is equal. Ttx indicates the time required for one data block to be sent from the rewriting device 20 to the ECU 10. Twr indicates the time required for one data block to be written into the ROM 16.

At time t1, the ECU 10 starts receiving a data block 1 sent by the rewriting device 20. At time t2, receiving the data block 1 is completed and the data block 1 is stored in the receiving buffer 12. At this time, the writing buffer 14 is empty because no data block has been written into the ROM 16. At time t2, transfer of the data block 1 stored in the receiving buffer 12 to the writing buffer 14 is started. At time t3 when the transfer from the receiving buffer 12 to the writing buffer 14 is completed, writing the data block 1 stored in the writing buffer 14 into the ROM 16 is started.

At time t3, free space is produced in the receiving buffer 12 because the transfer of the data block 1 to the writing buffer 14 is completed. Accordingly, at time t3, the ECU 10 starts receiving a data block 2 from the rewriting device 20. At time t4, receiving the data block 2 is completed and the data block 2 is stored in the receiving buffer 12.

At time t5, writing the data block 1 into the ROM 16 is completed, producing free space in the writing buffer 14. Accordingly, the data block 2 stored in the receiving buffer 12 is transferred to the writing buffer 14. At time t6 when the transfer of the data block 2 from the receiving buffer 12 to the writing buffer 14 is completed, writing the data block 2 into the ROM 16 is started.

At time t6, free space is produced in the receiving buffer because the transfer of the data block 2 to the writing buffer 14 is completed. Accordingly, at time t6, receiving a data block 3 from the rewriting device 20 is started. At time t7, receiving the data block 3 is completed and the data block 3 is stored in the receiving buffer 12.

At time t8, writing the data block 2 into the ROM 16 is completed, producing free space in the writing buffer 14. Accordingly, at time t8, transfer of the data block 3 stored in the receiving buffer 12 to the writing buffer 14 is started. At time t9 when the transfer of the data block 3 from the receiving buffer 12 to the writing buffer 14 is completed, writing the data block 3 into the ROM 16 is started.

Figure 12:
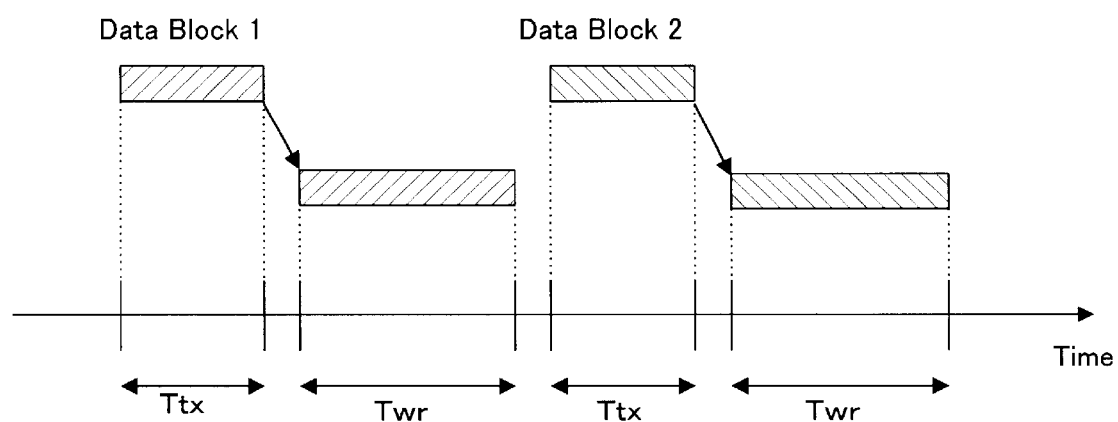
FIG. 12 is a timing chart for rewriting operation according to a conventional manner.

As can be seen in comparison with FIG. 12, according to rewriting control of the invention, when a data block is written into the memory, a subsequent data block is received. Thus, the time required to rewrite data stored in the ROM is reduced. According to conventional rewriting operation as shown in FIG. 12, the rewriting time for Nx cycles is at least "(Ttx+Twr)×Nx." More precisely, the rewriting time for Nx cycles is represented by "(Ttx+Twr+α)×Nx," wherein a indicates the sum of a delay time between an end time of receiving a data block and a start time of writing the data block, and a delay time between an end time of writing the data block and a start time of receiving another data block.

In the example shown in FIG. 4, the rewriting time for Nx cycles is "(Twr+β)×Nx" (However, the rewriting time does not include a sending time from t1 to t2 and a transfer time from t2 to t3 in the first cycle). Here, β indicates a delay time (for example, "t6–t5") between a start time of transferring a data block from the receiving buffer 12 to the writing buffer 14 and a start time of writing the data block into the writing buffer 14. β has a much smaller value than Twr because the receiving buffer 12 and the writing buffer 14 are typically implemented by a RAM providing fast access. Thus, as shown in FIG. 4, writing a data block is performed in parallel with sending a subsequent data block, reducing the rewriting time by about half.

When Ttx<Twr as shown in FIG. 4, the rewriting time for Nx cycles is represented by "(Twr+β)×Nx." In contrast, when Ttx>Twr, it is represented by "(Ttx+β)×Nx." As can be seen from these equations, in order to reduce the rewriting time more, it is preferable to select the size of a data block so that the sending time Ttx and the writing time Twr for one data block are about the same.

Figure 5:
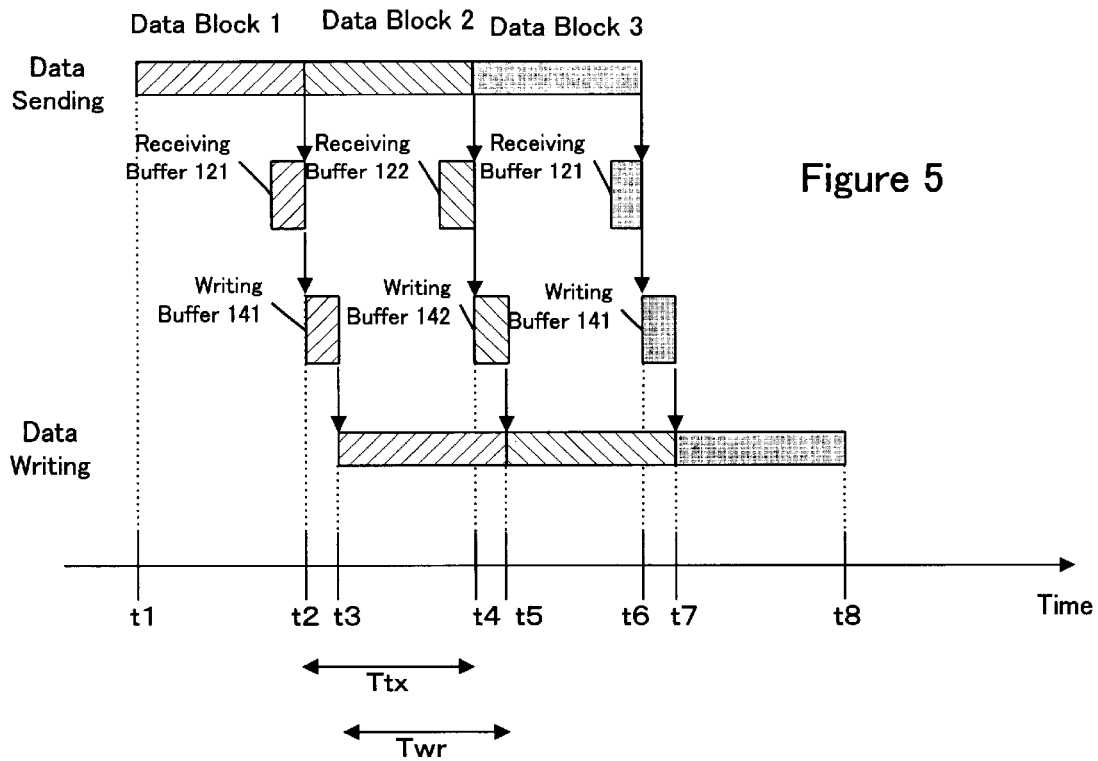
FIG. 5 is a timing chart for rewriting operation when two receiving buffers and two writing buffers are provided according to one embodiment of the invention.

FIG. 5 shows another example of a timing chart for rewriting operation wherein two receiving buffers 121 and 122 and two writing buffers 141 and 142 are provided. It is assumed that the size of each data block is equal. It is also assumed that the sending time Ttx and the writing time Twr are about the same.

At time t1, the ECU 10 starts receiving a data block 1 sent by the rewriting device 20. At time t2, receiving the data block 1 is completed and the data block 1 is stored in the receiving buffer 121. At this time, the writing buffers 141 and 142 are empty because no data block has been written into the ROM 16. Accordingly, at time t2, the data block 1 stored in the receiving buffer 121 is transferred to the writing buffer 141. At time t3 when the transfer of the data block 1 from the receiving buffer 121 to the writing buffer 141 is completed, the data block 1 stored in the writing buffer 141 is read out to start writing it into the ROM 16.

At time t2, there is no free space in the receiving buffer 121 because the transfer from the receiving buffer 121 to the writing buffer 141 has not been completed. The other receiving buffer 122 is empty. Accordingly, the ECU 10 starts receiving a next data block 2 from the rewriting device 20. At time t4, receiving the data block 2 is completed and the data block 2 is stored in the receiving buffer 122.

At time t4, there is no free space in the writing buffer 141 because writing of the data block 1 into the ROM 16 has not been completed. The other writing buffer 142 is empty. Accordingly, the data block 2 stored in the receiving buffer 122 is transferred to the writing buffer 142.

At time t5 when writing the data block 1 into the ROM 16 is completed, the data block 2 is read out from the writing buffer 142 to start writing it into the ROM16.

On the other hand, at time t3, the receiving buffer 121 is made empty. Accordingly, at time t4, the ECU 10 starts receiving a data block 3 from the rewriting device 20. At time t6, receiving the data block 3 is completed and the data block 3 is stored in the receiving buffer 121.

At time t5, the writing buffer 141 is made empty because writing the data block 1 into the ROM 16 is completed. Accordingly, at time t6, the data block 3 stored in the receiving buffer 121 is transferred to the writing buffer 141. At time t7, writing the data block 3 into the ROM16 is started.

As shown in FIG. 5, when the writing time Twr and sending time Ttx are about the same, two receiving buffers and two writing buffers thus provided eliminate the above-described delay time "β" between a start time of transfer from the receiving buffer to the writing buffer and a start time of writing to the ROM. Therefore, the rewriting time for Nx cycles is represented by "Ttx (or Twr)×Nx" (However, the rewriting time does not include a sending time from t1 to t2 and a transfer time from t2 to t3 in the first cycle). Thus, the rewriting time is further reduced compared to that of FIG. 4.

Figure 6:
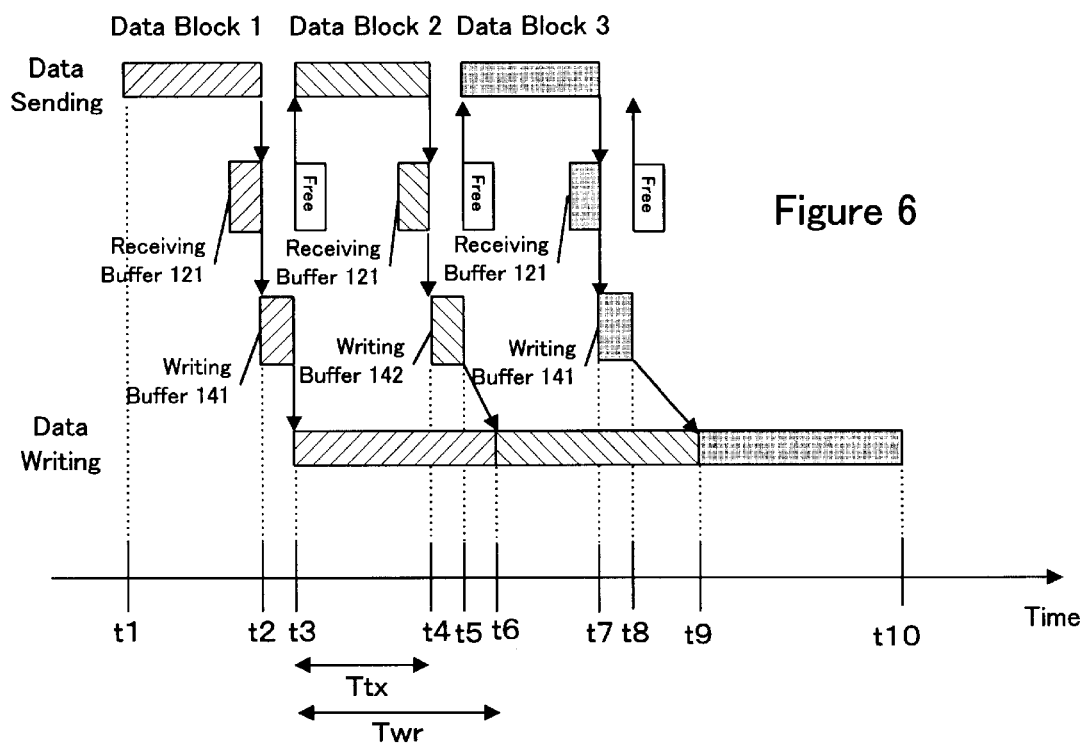
FIG. 6 is a timing chart for rewriting operation when one receiving buffer and two writing buffers are provided according to one embodiment of the invention.

FIG. 6 shows another example of a timing chart for rewriting operation wherein one receiving buffer 121 and two writing buffers 141 and 142 are provided. It is assumed that the size for each data block is equal. It is also assumed that the writing time Twr is longer than the sending time Ttx.

At time t1, the ECU 10 starts receiving a data block 1 sent by the rewriting device 20. At time t2, receiving the data block 1 is completed and the data block 1 is stored in the receiving buffer 121. At this time, the writing buffers 141 and 142 are empty because no data block has been written to the ROM 16. Accordingly, at time t2, the data block 1 stored in the receiving buffer 121 is transferred to the writing buffer 141. At time t3 when the transfer of the data block 1 from the receiving buffer 12 to the writing buffer 141 is completed, the data block 1 stored in the writing buffer 141 is read out to start writing it in the ROM 16.

At time t3, free space is produced in the receiving buffer 121 because the transfer from the receiving buffer 121 to the writing buffer 141 is completed. Accordingly, at time t3, receiving a next data block 2 from the rewriting device 20 is started. At time t4, receiving the data block 2 is completed and the data block 2 is stored in the receiving buffer 121.

At time t4, there is no free space in the writing buffer 141 because writing the data block 1 into the ROM 16 has not been completed. The other writing buffer 142 is empty. Accordingly, at time t4, transfer of the data block 2 stored in the receiving buffer 121 to the writing buffer 142 is started. The transfer is completed at time t5. At time t6 when writing the data block 1 into the ROM 16 is completed, the data block 2 is read out from the writing buffer 142 to start writing it into the ROM 16. Writing the data block 2 is completed at time t9.

On the other hand, at time t5 when the transfer of the data block 2 from the receiving buffer 121 to the writing buffer 142 is completed, free space is produced in the receiving buffer 121. Accordingly, the ECU 10 starts receiving a data block 3 from the rewriting device 20. Receiving the data block 3 is completed at time t7 and the received data block 3 is stored in the receiving buffer 121.

At time t6 when writing the data block 1 into the ROM 16 is completed, free space is produced in the writing buffer 141. Accordingly, at time t7, the data block 3 stored in the receiving buffer 121 is transferred to the writing buffer 141. The transfer is completed at time t8. At time t9 when writing the data block 2 into the ROM 16 is completed, the data block 3 is read out from the writing buffer 141 to start writing it into the ROM 16. Writing the data block 3 is completed at time t10.

As shown in FIG. 6, it is preferable that writing operation for data blocks is continuously performed when the writing time Twr is longer than the sending time Ttx. The number of writing buffers is determined to be more than the number of receiving buffers so that the writing operation is performed continuously. According to the example shown in FIG. 6, the rewriting time for Nx cycles is represented by "Twr×Nx" (However, the rewriting time does not include the time from t1 to t3 in the first cycle). Thus, even when the sending time Ttx and the writing time Twr are different, it is possible to reduce the rewriting time by adjusting the numbers of the receiving buffers and the writing buffers.

When the sending time Ttx is longer than the writing time Twr, it is preferable that receiving operation for data blocks is continuously performed. In this case, the number of receiving buffers is determined to be more than the number of writing buffers. The rewriting time for Nx cycles is represented by "Ttx×Nx."

Figure 7:
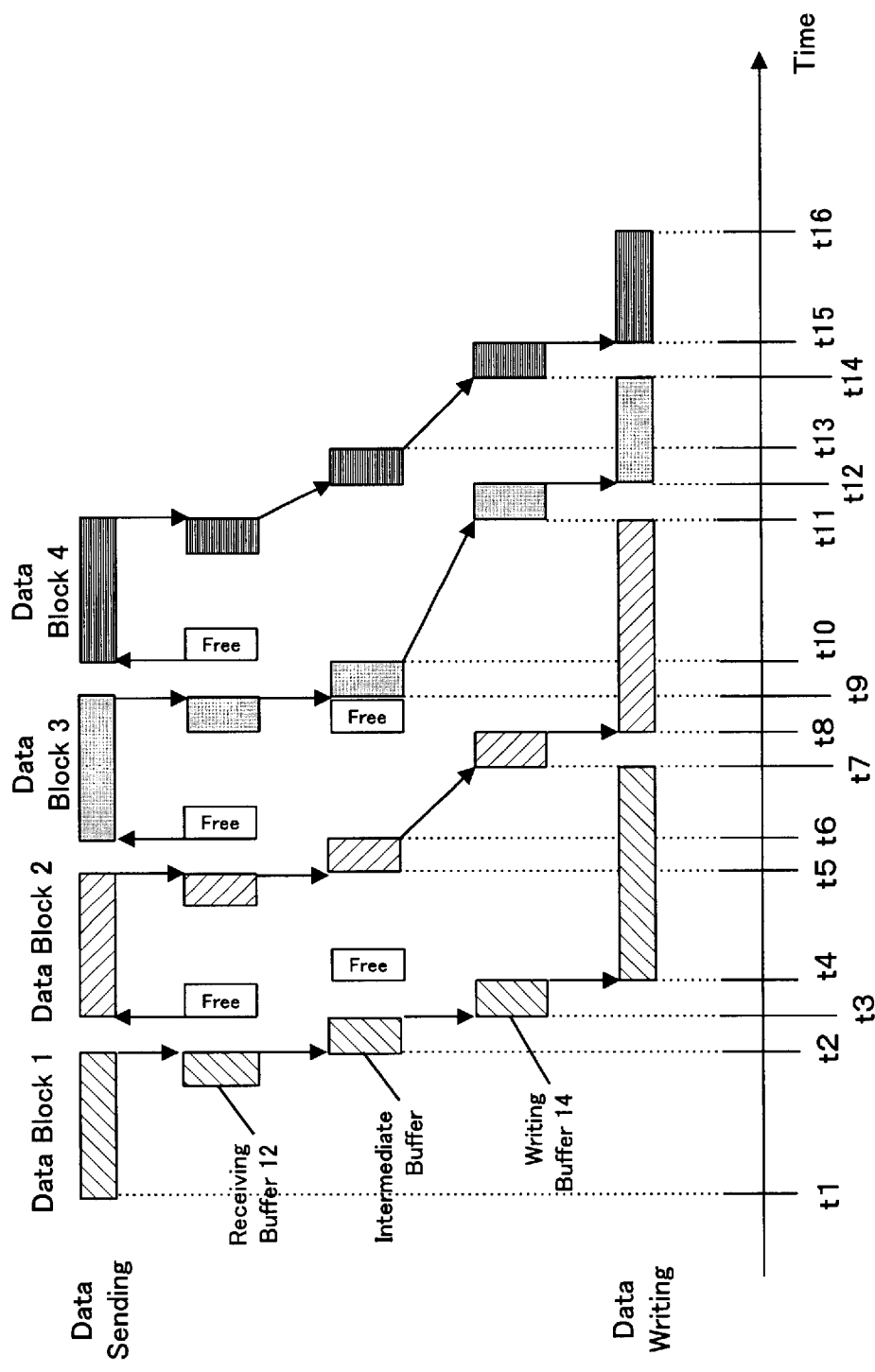
FIG. 7 is a timing chart for rewriting operation when one receiving buffer, one writing buffer and one intermediate buffer are provided according to one embodiment of the invention.

FIG. 7 shows another example of a time chart for rewriting operation wherein one intermediate buffer (which is not illustrated in FIG. 1) is provided between the receiving buffer 12 and the writing buffer 14. There is a variation in writing time, depending on data included in a data block and computer environments. Such a variation occurs whether the size of each data block is equal or different. In such a case, an intermediate buffer accommodates a variation in writing time.

At time t1, the ECU 10 starts receiving a data block 1 sent by the rewriting device 20. At time t2, receiving the data block 1 is completed and the data block 1 is stored in the receiving buffer 12. At this time, the intermediate buffer and the writing buffer 14 are empty because no data block has been written to the ROM 16. The data block 1 stored in the receiving buffer 12 is transferred to the intermediate buffer. The data block 1 transferred to the intermediate buffer is further transferred to the writing buffer 14. At time t4 when the transfer to the writing buffer is completed, writing the data block 1 stored in the writing buffer 14 into the ROM 16 is started.

At time t3, free space is produced in the receiving buffer 12 because the transfer of the data block 1 to the intermediate buffer is completed. Accordingly, at time t3, the ECU 10 starts receiving a data block 2 from the rewriting device 20. At time t5, receiving the data block 2 is completed and the data block 2 is stored in the receiving buffer 12. At time t5, since the intermediate buffer is empty, the data block 2 stored in the receiving buffer 12 is transferred to the intermediate buffer.

At time t7 when writing the data block 1 into the ROM 16 is completed, free space is produced in the writing buffer 14. At time t7, transfer of the data block 2 stored in the intermediate buffer to the writing buffer 14 is started. At time t8 when the transfer from the intermediate buffer to the writing buffer 14 is completed, writing the data block 2 into the ROM 16 is started.

At time t6, free space is produced in the receiving buffer 12 because the transfer of the data block 2 to the intermediate buffer is completed. The ECU 10 starts receiving a data block 3 from the rewriting device 20. At time t9, receiving the data block 3 is completed and the data block 3 is stored in the receiving buffer 12. At time t9, since the intermediate buffer is empty, the data block 3 stored in the receiving buffer 12 is transferred to the intermediate buffer.

At time t11 when writing the data block 2 into the ROM 16 is completed, free space is produced in the writing buffer 14. Accordingly, at time t11, transfer of the data block 3 stored in the intermediate buffer 12 to the writing buffer 14 is started. At time t12 when the transfer is completed, writing the data block 3 into the ROM 16 is started.

At time t10, free space is produced in the receiving buffer 12 because the transfer of the data block 3 to the intermediate buffer is completed. The ECU 10 starts receiving a data block 4 from the rewriting device 20. At time t11, receiving the data block 4 is completed and the data block 4 is stored in the receiving buffer 12. At time t12 when the transfer of the data block 3 to the writing buffer 14 is completed, free space is produced in the intermediate buffer. Accordingly, at time t12, transfer of the data block 4 from the receiving buffer 12 to the intermediate buffer is started.

At time t14, writing the data block 3 into the ROM 16 is completed, producing free space in the writing buffer 14. At time t14, transfer of the data block 4 stored in the intermediate buffer to the writing buffer 14 is started. At time t15 when the transfer is completed, writing the data block 4 into the ROM 16 is started.

Thus, by providing the intermediate buffer, the receiving buffer is made empty without waiting for a start of writing a data block. More specifically, in the example shown in FIG. 4, the receiving buffer is made empty when writing a data block is started. In the example shown in FIG. 7, the receiving buffer is made empty during writing of a data block (for example, time t6 and t10) by virtue of the intermediate buffer. Therefore, even when the writing time Twr is longer than the sending time Ttx as shown by data block 1 and data block 2 of FIG. 7, it is possible to receive a data block for the next or a subsequent cycle while a data block received in the current cycle is being written into the memory.

Thus, in the case in which a sequence of data blocks to be received comprises data blocks each having the writing time Twr longer than the sending time Ttx (as shown by data blocks 1 and 2) and data blocks each having the writing time Twr shorter than the sending time Ttx (as shown by data blocks 3 and 4), a variation in writing time is accommodated by providing the intermediate buffer. As a result, receiving operation as well as writing operation for data blocks can be continuously performed so that the rewriting time is reduced.

Alternatively, a plurality of intermediate buffers may be provided between the receiving buffer and the writing buffer. For example, a first intermediate buffer and a second intermediate buffer may be provided. In this case, when writing is completed and free space is produced in the writing buffer, a data block stored in the second intermediate buffer is transferred to the writing buffer. When the transfer to the writing buffer is completed and free space is produced in the second intermediate buffer, the data block stored in the first intermediate buffer is transferred to the second intermediate buffer. When the transfer to the second intermediate buffer is completed and free space is produced in the first intermediate buffer, the data block stored in the receiving buffer is transferred to the first intermediate buffer. By providing a plurality of intermediate buffers, the range of variation in writing time that the intermediate buffers can accommodate increases.

Figure 8:
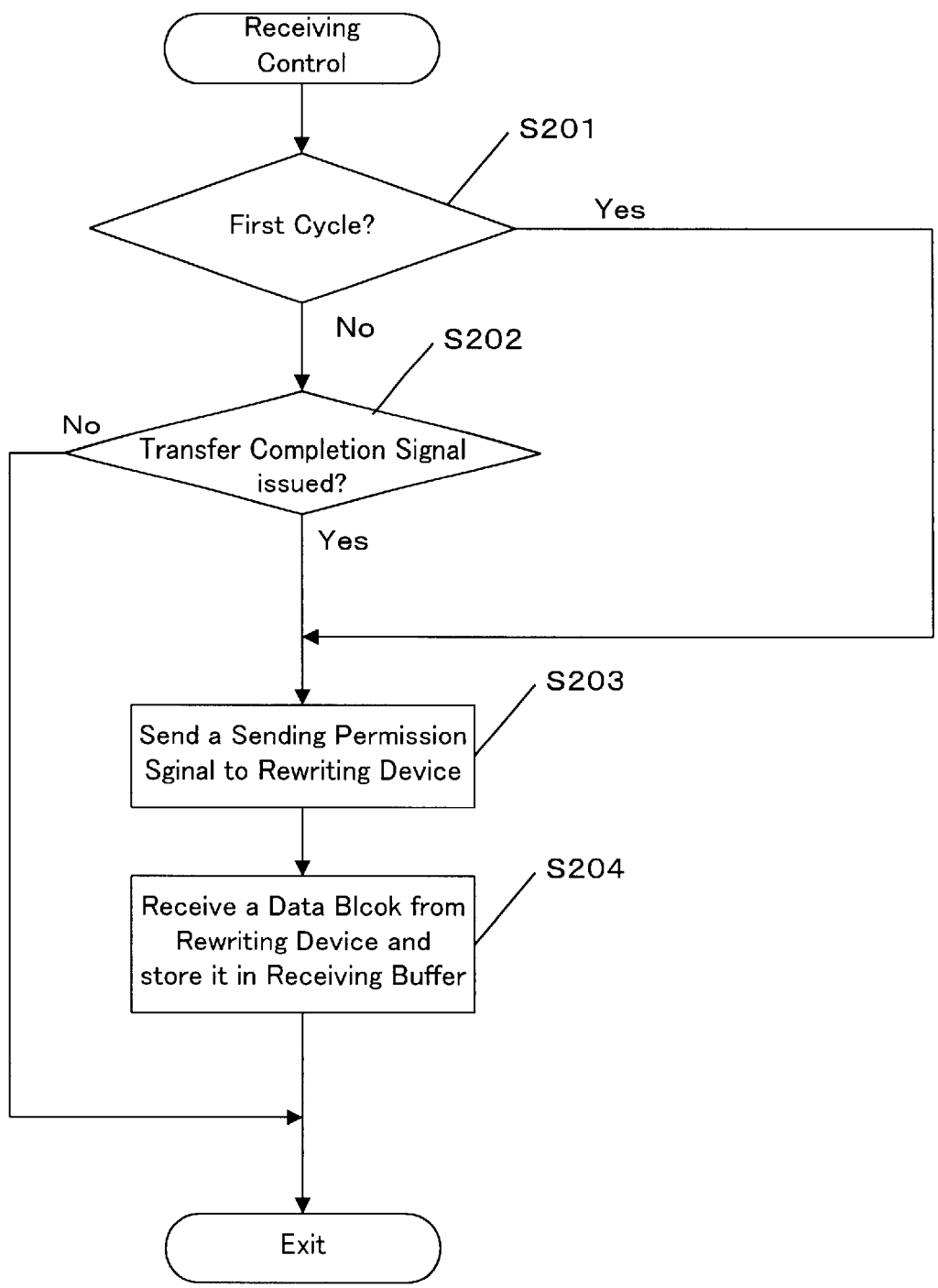
FIG. 8 is a flowchart showing a process for receiving control according to the first embodiment of the invention.

FIG. 8 is a flowchart showing a process performed by the receiving part 11 of the ECU 10 for receiving control of a data block in accordance with the first embodiment shown in FIG. 2.

In step S201, it is determined whether a cycle in which the process is being performed is the first cycle. If so, step S202 is skipped. If a cycle in which the process is being performed is the second or a subsequent cycle, the process proceeds to step S202. In the first cycle, a transfer completion signal is not issued because no data block to be written into the ROM 16 has been received. Therefore, the process skips step S202. In the first cycle, the receiving buffer 12 is empty.

In step S202, it is determined whether the transfer completion signal has been issued. In other words, it is determined whether a data block received in the previous cycle has been transferred to the writing buffer 14. If the transfer has been completed, it indicates that there is free space in the receiving buffer 12. The process proceeds to step S203, in which a sending permission signal is sent to the rewriting device 20. In step S204, a data block is received from the rewriting device 20 and the received data block is stored in the receiving buffer 12. If it is determined in step S202 that the transfer completion signal has not been issued, it indicates that there is no free space in the receiving buffer, the process exiting the routine.

Thus, according to the first embodiment, the transfer completion signal enables the ECU 10 to determine whether there is free space in the receiving buffer 12. If it is determined that there is free space in the receiving buffer, the ECU 10 requests the rewriting device 20 to send a data block so as to start receiving the data block.

Figure 9:
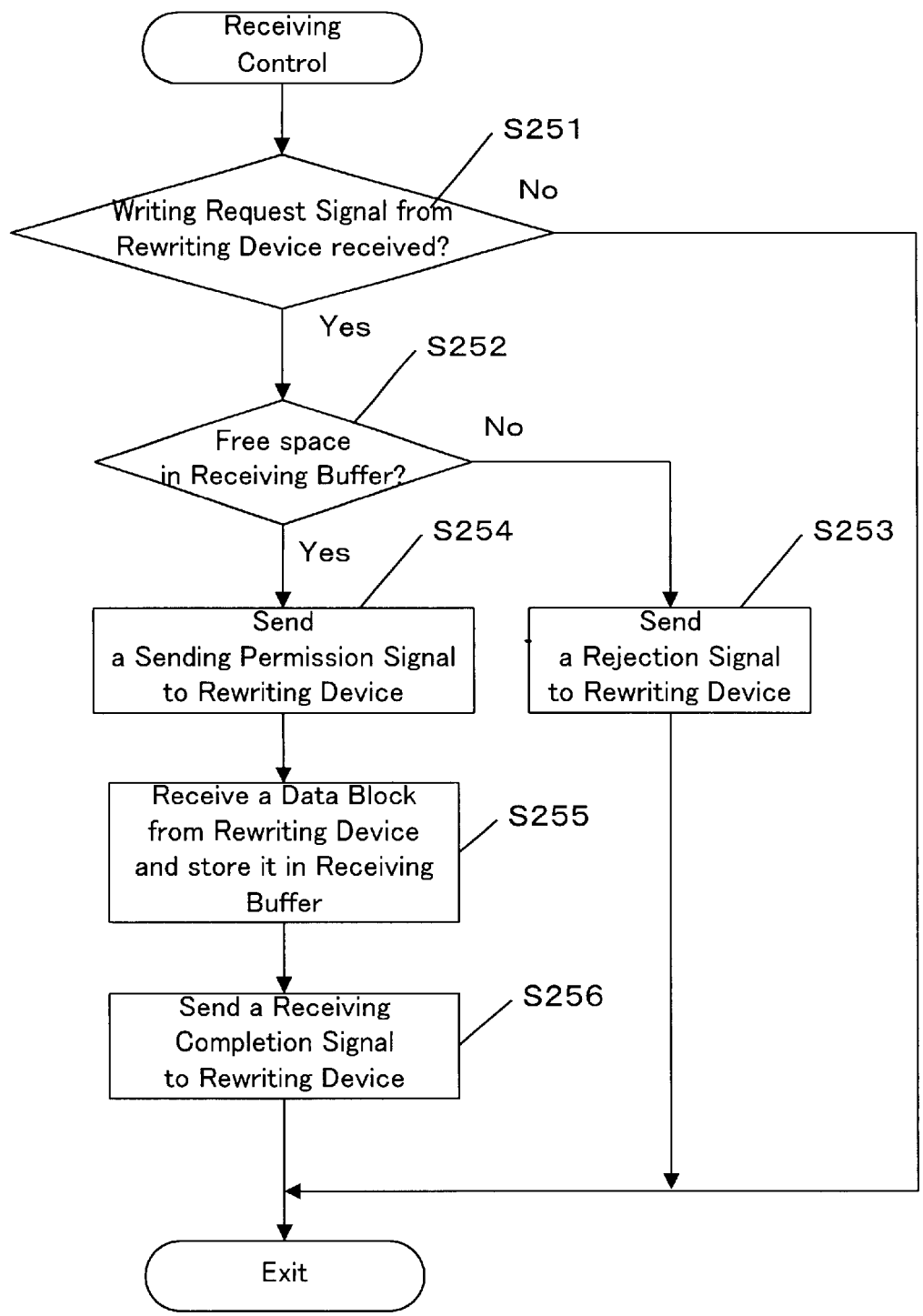
FIG. 9 is a flowchart showing a process for receiving control according to the second embodiment of the invention.

FIG. 9 is a flowchart showing a process performed by the receiving part 11 of the ECU 10 for receiving control of a data block in accordance with the second embodiment shown in FIG. 3.

In step S251, it is determined whether a writing request signal has been received from the rewriting device 20. If the writing request signal has not been received, the process exits the routine. If the writing signal has been received, it is determined whether there is free space in the receiving buffer 12 (S252). If there is no free space, a rejection signal is sent to the rewriting device 20 (S253). If there is free space, a sending permission signal is sent to the rewriting device 20 (S254).

In step S255, a data block sent from the rewriting device 20 is received and stored in the receiving buffer 12. The process proceeds to step S256, in which a receiving completion signal is sent to the rewriting device 20.

Thus, according to the second embodiment, free space in the receiving buffer 12 is checked in response to the writing request from the rewriting device 20. When it is determined that there is free space in the receiving buffer, the ECU requests the rewriting device 20 to send a data block and starts receiving the data block.

Figure 10:
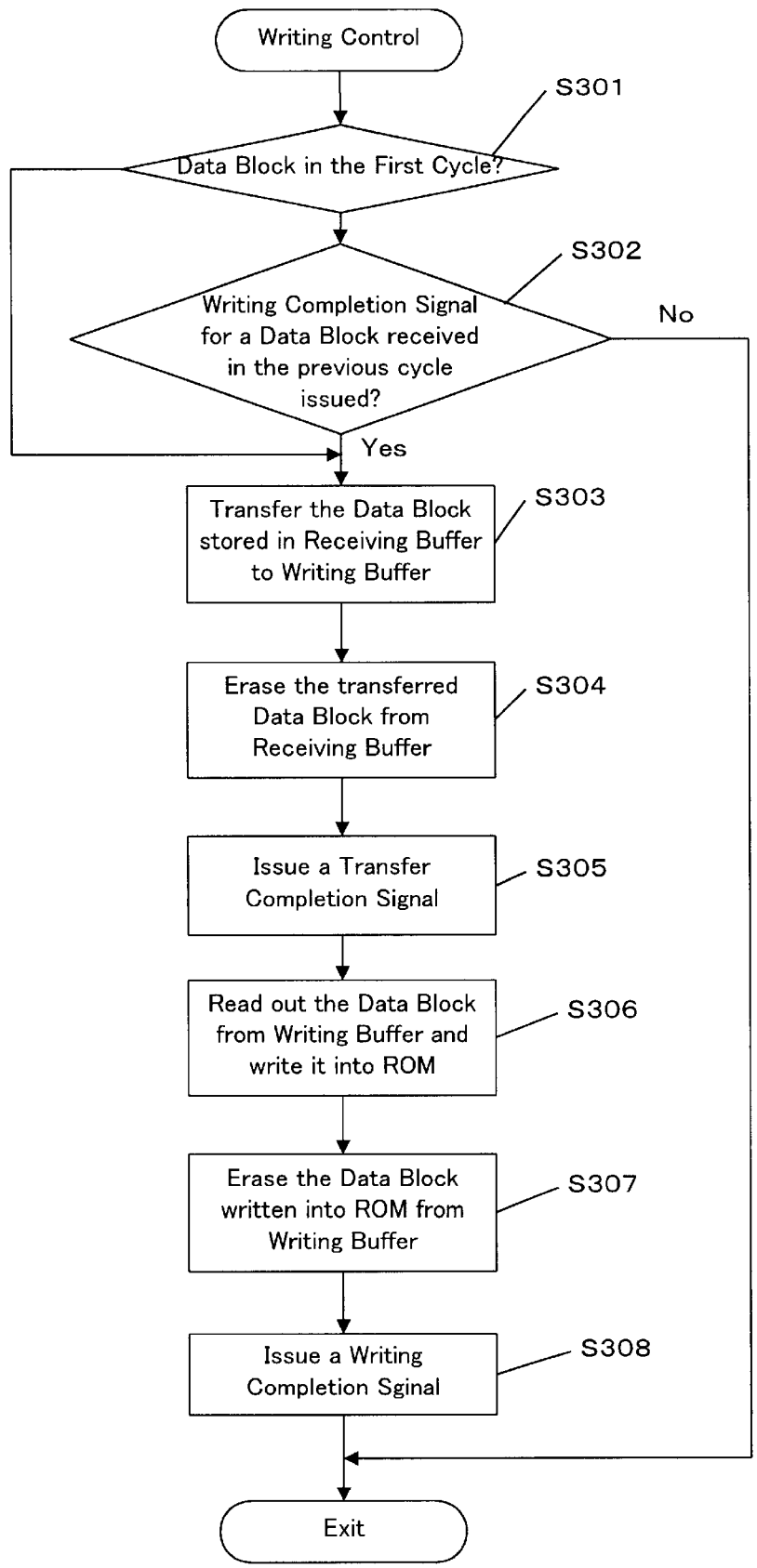
FIG. 10 is a flowchart showing a process for writing control according to one embodiment of the invention.

FIG. 10 is a flowchart of a process for writing control of a data block wherein at least one writing buffer and at least one receiving buffer are provided (refer to FIGS. 4 through 6), which is performed by the transfer part 13 and the writing part 15.

In step S301, it is determined whether the data block stored in the first buffer is a data block received in the first cycle. If so, the process proceeds to step S303. If not, the process proceeds to step S302. If the data block stored in the first buffer is a data block received in the first cycle, a writing completion signal is not issued because no data block has been written into the ROM 16. Therefore, in this case, step S302 is skipped.

In step S302, it is determined whether the writing completion signal has been issued for a data block received in the previous cycle. If the writing completion signal has not been issued, it indicates that writing the data block has not been completed, the process exiting the routine. If the writing completion signal has been issued, the data block for the current cycle, stored in the receiving buffer 12 is read out and then stored in the writing buffer 14 (S303). In step S304, the data block transferred in step S303 is erased from the receiving buffer 12, producing free space in the receiving buffer 12. In step S305, a transfer completion signal is issued.

In step S306, the data block transferred to the writing buffer 14 is read out and written into the ROM 16. If writing the data block into the ROM 16 is completed, the data block read out in step S306 is erased from the writing buffer 12, producing free space in the writing buffer 14 (S307). The process proceeds to step 308, in which a writing completion signal is issued.

The writing control shown in FIG. 10 is applicable to the receiving control shown in FIGS. 8 and 9. However, the receiving control shown in FIG. 9 does not require the writing control shown in FIG. 10 to issue the transfer completion signal shown in step S305.

Figure 11:
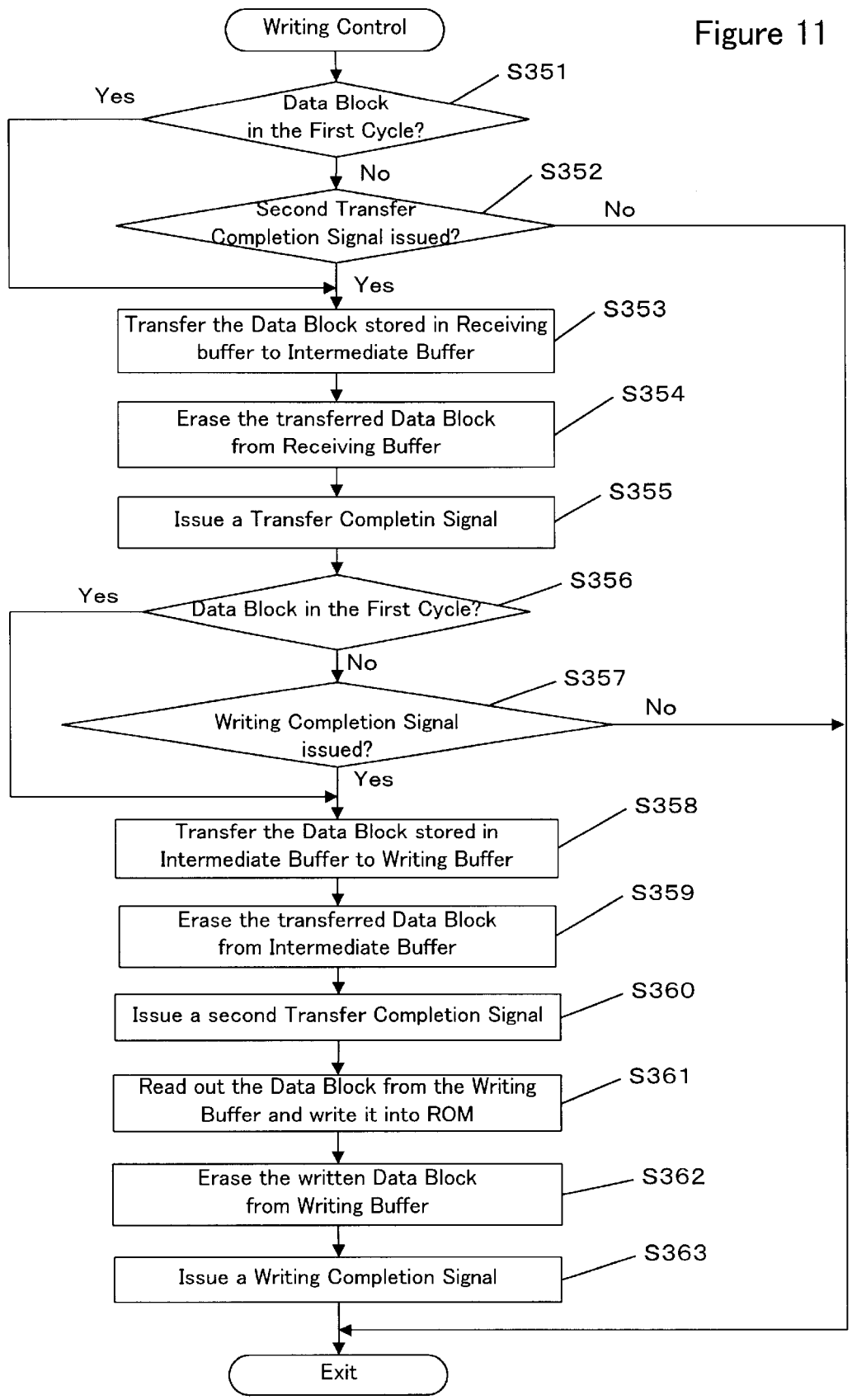
FIG. 11 is a flowchart showing a process for writing control when an intermediate buffer is provided according to one embodiment of the invention.

FIG. 11 is a flowchart of a process for writing control of a data block wherein one intermediate buffer is provided between the receiving buffer and the writing buffer (refer to FIG. 7), which is performed by the transfer part 13 and the writing part 15.

In step S351, it is determined whether the data block stored in the first buffer is a data block received in the first cycle. If so, the process proceeds to step S353. If not, the process proceeds to step S352.

In step S352, it is determined whether a second transfer completion signal has been issued. The second transfer completion signal is a signal to be issued when the transfer of a data block from the intermediate buffer to the writing buffer is completed. If the second transfer completion signal has not been issued, it indicates that free space is not produced in the intermediate buffer, the process exiting the routine. If the second transfer completion signal has been issued, the data block stored in the receiving buffer 12 is read out and stored in the intermediate buffer (S353). In step S354, the data block transferred in step S353 is erased from the receiving buffer 12, producing free space in the receiving buffer 12. In step S355, a transfer completion signal is issued.

In step S356, it is determined whether the data block stored in the intermediate buffer is a data block received in the first cycle. If so, the process proceeds to step S358. If not, the process proceeds to step S357.

In step S357, it is determined whether a writing completion signal has been issued. If the writing completion signal has not been issued, it indicates that writing has not been completed and there is no free space in the writing buffer 14, the process exiting the routine. If the writing completion signal has been issued, the data block stored in the intermediate buffer is read out and stored in the writing buffer 14 (S358). In step S359, the data block transferred in step 358 is erased from the intermediate buffer, producing free space in the intermediate buffer. In step S360, a second transfer completion signal is issued.

The process proceeds to step S361, in which the data block transferred to the writing buffer 14 is read out and written into the ROM 16. If writing the data block into the ROM 16 is completed, the data block read out in step S361 is erased from the writing buffer 14, producing free space in the writing buffer (S362). The process proceeds to step 363, in which a writing completion signal is issued.

The writing control shown in FIG. 11 is applicable to the receiving control shown in FIGS. 8 and 9. However, the receiving control shown in FIG. 9 does not require the writing control to issue the transfer completion signal, as shown in step S355 of FIG. 11.

Thus, a process for receiving a data block to store it in the receiving buffer is performed in parallel with a process for transferring another data block to the writing buffer to write it into the ROM. As a result, the rewriting time is reduced.

In the above-described embodiments, a data block is erased from the receiving buffer when transfer of the data block from the receiving buffer to the writing buffer is completed. A data block is also erased from the writing buffer when writing the data block into the ROM is completed. However, when the receiving buffer and the writing buffer are capable of storing a plurality of data blocks, it is not necessary to perform such erasure operation every time the transfer and writing operation are completed. As long as there is enough free space to store at least one data block at the time of completion of the transfer and writing operation, the erasure operation may be performed at any appropriate time. For example, erasure operation may be performed in a first-in first-out manner. By a way of example, if the receiving buffer can store five data blocks, data blocks 1 to 5 are sequentially received and transferred to the writing buffer. When the data block 5 has been transferred to the writing buffer, the oldest data block 1 is erased from the receiving buffer 12, producing free space in the receiving buffer 12. A similar manner is applicable to the writing buffer. Of course, such a first-in first-out manner may be applied to the intermediate buffer.

Furthermore, in the examples shown in FIGS. 4 through 6, a data block for the current cycle is received while a data block for the previous cycle is being written in the ROM. However, if the receiving buffer and/or the writing buffer are capable of storing a plurality of data blocks, a data block for the next or a subsequent cycle may be received while a data block for the previous cycle is being written in the ROM. Although receiving operation and writing operation are performed in accordance with a sequence of data blocks, receiving operation of a data block in a certain cycle may be performed in parallel with writing operation for a data block in any cycle.

What is claimed is:

1. A vehicle controller comprising:

a first buffer for storing at least one data block;

a second buffer for storing at least one data block;

a rewritable nonvolatile memory for storing information for controlling a vehicle;

means for receiving a data block from an external rewriting device to store it in the first buffer;

means for transferring the data block stored in the first buffer to the second buffer;

means for writing the data block stored in the second buffer into the memory;

wherein when said means for writing is writing a first data block into the memory, said means for receiving receives a subsequent data block.

2. The vehicle controller of claim 1, wherein the receiving means starts receiving the subsequent data block from the external rewriting device in response to completion of transferring the first data block.

3. The vehicle controller of claim 1, wherein the receiving means determines whether there is free space in the first buffer;

wherein, if there is free space in the first buffer, the receiving means starts receiving the subsequent data block from the external rewriting device.

4. The vehicle controller of claim 1, wherein the transfer means starts transferring the subsequent data block from the first buffer to the second buffer in response to completion of writing the first data block into the memory.

5. The vehicle controller of claim 1, wherein, after writing the first data block into the memory is completed, the writing means starts writing the subsequent data block into the memory if the subsequent data block is stored in the second buffer by the transfer means;

whereby a delay between an end of writing the first data block and a start of writing the subsequent data block is equal to or less than a time required to transfer the subsequent data block from the first buffer to the second buffer.

6. The vehicle controller of claim 1, wherein, after receiving the first data block is completed, the receiving means starts receiving the subsequent data block if free space is produced in the first buffer by the transfer means;

whereby a delay between an end of receiving the first data block and a start of receiving the subsequent data block is equal to or less than a time required to transfer the first data block from the first buffer to the second buffer.

7. The vehicle controller of claim 1, further comprising at least one intermediate buffer provided between the first buffer and the second buffer;

wherein the transfer means further comprises a first transfer means for transferring a data block stored in the first buffer to the intermediate buffer and a second transfer means for transferring the data block stored in the intermediate buffer to the second buffer;

wherein the first transfer means starts transferring the subsequent data block if transferring the first data block from the intermediate buffer to the second buffer is completed to produce free space in the intermediate buffer;

wherein the second transfer means starts transferring the subsequent data block if writing the first data block into the memory is completed to produce free space in the second buffer.

8. The vehicle controller of claim 1, wherein the first and second buffers are implemented by a memory having an access time faster than the nonvolatile memory.

9. A method for rewriting a rewritable nonvolatile memory included in a vehicle controller, the memory storing information for controlling a vehicle, the vehicle controller comprising a first buffer storing at least one data block and a second buffer for storing at least one data block, the method comprising:

(a) receiving a data block from an external rewriting device to store it in the first buffer;

(b) transferring the data block stored in the first buffer to the second buffer;

(c) writing the data block stored in the second buffer into the memory;

wherein when the step (c) for a first data block is performed, the step (a) for a subsequent data block is performed.

10. The method of claim 9, wherein the step (a) for the subsequent data block is started in response to completion of transferring the first data block.

11. The method of claim 9, wherein the step (a) for the subsequent data block further comprises determining whether there is free space in the first buffer;

wherein, if there is free space in the first buffer, the step (a) for the subsequent data block is started.

12. The method of claim 9, wherein the step (b) for the subsequent data block is started in response to completion of writing the first data block into the memory.

13. The method of claim 9, wherein the step (b) for the subsequent data block further includes erasing the subsequent data block from the first buffer in response to completion of transferring the subsequent data block.

14. The method of claim 9, wherein the step (c) for the subsequent data block further includes erasing the subsequent data block from the second buffer in response to completion of writing the subsequent data block into the memory.

15. The method of claim 9, wherein the step (b) for the subsequent data block is started in response to completion of writing the first data block into the memory;

wherein the step (c) for the subsequent data block is started in response to completion of transferring the subsequent data block;

whereby a delay between an end of writing the first data block and a start of writing the subsequent data block is equal to or less than a time required to transfer the subsequent data block from the first buffer to the second buffer.

16. The method of claim 9, wherein the step (b) for the first data block is started in response to completion of receiving the first data block;

wherein the step (a) for the subsequent data block is started in response to completion of transferring the first data block;

whereby a delay between an end of receiving the first data block and a start of receiving the subsequent data block is equal to or less than a time required to transfer the first data block from the first buffer to the second buffer.

17. The method of claim 9, wherein the second buffer stores two or more data blocks;

wherein the step (b) for the subsequent data block is started in response to completion of receiving the subsequent data block;

wherein the step (c) for the subsequent data block is started in response to completion of writing the first data block into the memory;

whereby there is no delay between an end of writing the first data block and a start of writing the subsequent data block.

18. The method of claim 9, wherein the first buffer stores two or more data blocks;

wherein the step (a) for the subsequent data block is started in response to completion of receiving the first data block;

whereby there is no delay between an end of receiving the first data block and a start of receiving the subsequent data block.

19. The method of claim 9, wherein an intermediate buffer is provided between the first buffer and the second buffer;

wherein the transfer step (b) further comprises:

(b1) transferring a data block stored in the first buffer to the intermediate buffer; and (b2) transferring the data block stored in the intermediate buffer to the second buffer;

wherein the second transfer step (b1) for the subsequent data block is started in response to completion of transferring the first data block from the intermediate buffer to the second buffer;

wherein the first transfer step (b2) for the subsequent data block is started in response to completion of writing the first data block into the memory.

20. The method of claim 19, wherein the step (b1) further comprises erasing the first data block from the first buffer to produce free space in the first buffer in response to completion of transferring the first data block from the first buffer to the intermediate buffer, wherein the step (b2) further comprises erasing the first data block from the intermediate buffer to produce free space in the intermediate buffer in response to completion of transferring the first data block from the intermediate buffer to the second buffer.

* * * * *